(12) United States Patent
Carreau

(10) Patent No.: US 8,004,448 B2
(45) Date of Patent: Aug. 23, 2011

(54) DUAL DAC STRUCTURE FOR CHARGE REDISTRIBUTED ADC

(75) Inventor: Gary Carreau, Plaistow, NH (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/618,852

(22) Filed: Nov. 16, 2009

(65) Prior Publication Data

US 2011/0115658 A1 May 19, 2011

(51) Int. Cl.
*H03M 1/12* (2006.01)
(52) U.S. Cl. ......................... 341/172; 341/156
(58) Field of Classification Search .................. 341/122, 341/155, 150, 156, 172
See application file for complete search history.

(56) References Cited

U.S. PATENT DOCUMENTS

| | | | | |
|---|---|---|---|---|
| 4,764,750 A | * | 8/1988 | Kawada | 341/122 |
| 4,831,381 A | * | 5/1989 | Hester | 341/172 |
| 5,566,034 A | * | 10/1996 | Shumaker | 360/77.04 |
| 5,684,487 A | * | 11/1997 | Timko | 341/172 |
| 6,559,789 B1 | * | 5/2003 | Somayajula | 341/172 |
| 6,587,066 B1 | * | 7/2003 | Somayajula | 341/172 |
| 6,882,298 B2 | * | 4/2005 | Leung et al. | 341/172 |
| 6,958,722 B1 | | 10/2005 | Janakiraman et al. | |
| 7,167,121 B2 | * | 1/2007 | Carreau et al. | 341/150 |
| 7,271,758 B2 | * | 9/2007 | Piasecki et al. | 341/172 |

\* cited by examiner

*Primary Examiner* — Jean B Jeanglaude
(74) *Attorney, Agent, or Firm* — Kenyon & Kenyon LLP

(57) ABSTRACT

A system for converting an analog signal to a digital codeword having N bit positions that includes a dual DAC structure having a small DAC and a large DAC. At least one comparator is coupled to the small DAC and large DAC. The small DAC performs bit trials to calculate bit positions 1 to M, and the large DAC with performs bit trial calculates bit positions M+1 to N after having been set with bit decisions from the bit trials of the small DAC.

36 Claims, 6 Drawing Sheets

100

200

300

400

500

600

700

DUAL DAC STRUCTURE FOR CHARGE REDISTRIBUTED ADC

BACKGROUND

Analog to digital converters (ADCs) are well known circuits that generate a digital codeword representing an analog signal. As with many electronic circuits, power consumption is an important design element in ADCs. Accordingly, charge redistributed ADCs are preferable in many circuit applications because they generally require low power. Often, charge redistributed ADCs include an array of binary weighted capacitors in which charge is captured from an input voltage. Each capacitor corresponds to a binary bit position of the digital codeword, and each capacitor is weighted according to the capacitor's corresponding binary bit position. For example, the capacitor that corresponds to the most significant bit may have largest capacitance in the array while the capacitor that corresponds to the least significant bit may have the smallest capacitance in the array. However, in noise dominated ADCs the number and size of the capacitors correlate to the noise particularly in high resolution ADCs because the noise in ADCs varies as the square root of the overall capacitance (noise a ($1/\sqrt{Cap}$)).

Charge redistributed ADCs operate by comparing various thresholds on a bitwise basis to convert the input analog voltage to a digital codeword. During the bitwise test, the ADC will perform bit trials for each of the bit positions. One plate of each capacitor must be charged and discharged for its corresponding bit trial requiring a large amount of power. Consequently, large capacitors require large switch devices to perform the bit trials. The large switch devices also require a large amount power and have long settling times. There is a need in the art for charge redistributed ADCs that consume less power and operate faster.

DETAILED DESCRIPTION

Embodiments of the present system provide a system for converting an analog signal to a digital codeword having N bit positions that includes a dual DAC structure having a small capacitor array ("small DAC") and a large capacitor array ("large DAC"). The large DAC includes a set of N capacitors corresponding to each of the N bit positions of the codeword. The small DAC includes a set of M capacitors and M switches. At least one comparator has a first input coupled to each of the small DAC and large DAC. During bit trials, bit positions 1 (the most significant bit) to M may be tested using the small DAC. Bit positions M+1 to N (the least significant bit) may be tested using the large DAC after setting switch values for bit positions 1 to M based on the small DAC bit trials.

Alternatively, the system includes a single DAC coupled to a comparator. The DAC includes a set of N capacitors and N switches corresponding to each of the N bit positions. The DAC also includes a bridging switch to selectively decouple a sub-set of N capacitors and N switches from the comparator during a first operation thereby defining an effective small DAC coupled to the comparator. Bit trials for positions 1 to M may be performed by the effective small DAC. After re-coupling the decoupled portion of the DAC to the comparator, bit trials for positions M+1 to N may be performed having set the switches of the most significant M bits using the bit decisions from the effective small DAC.

Figure 1:
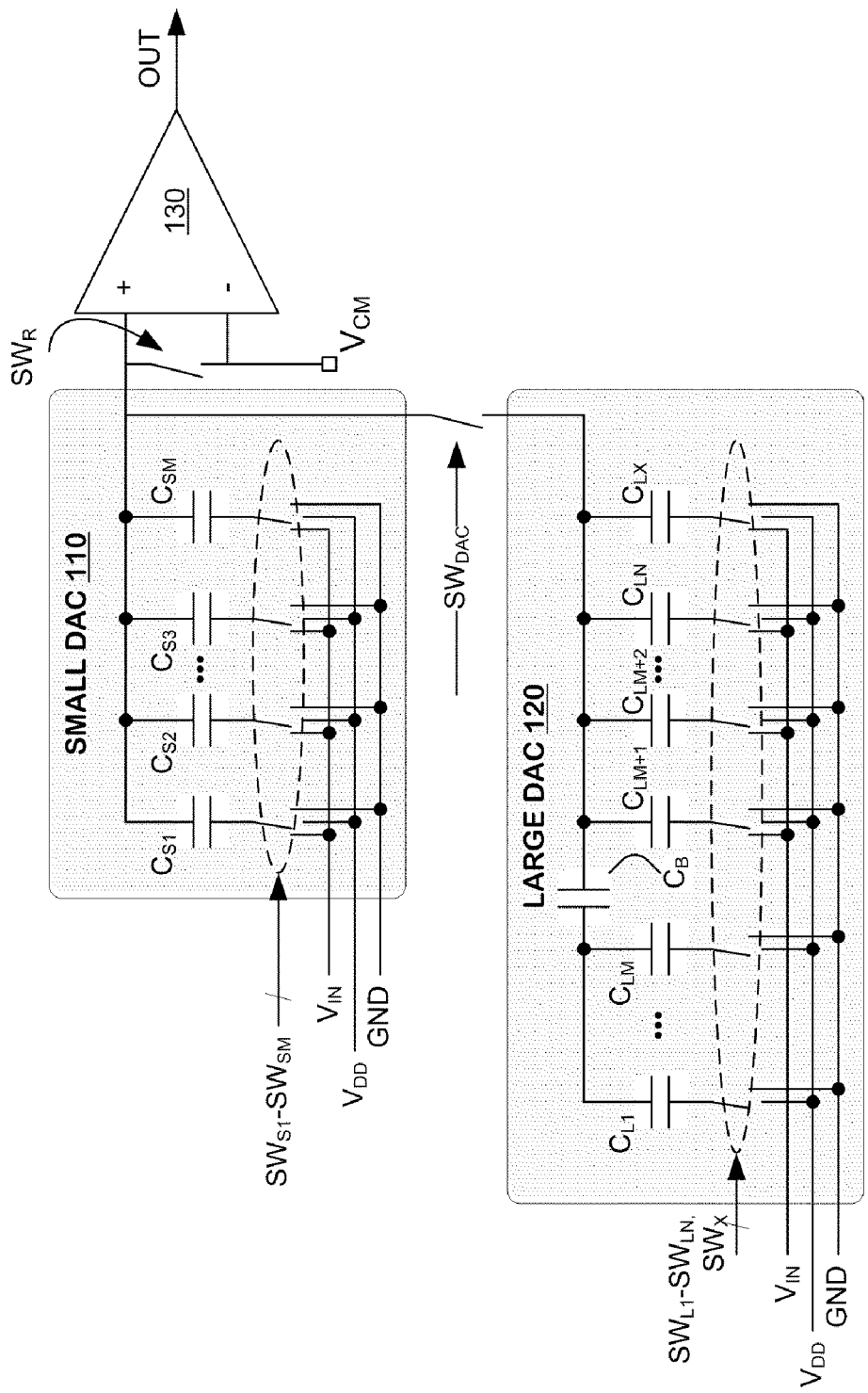
FIG. 1 is a simplified diagram of a charge redistributed ADC according to an embodiment of the present invention.

FIG. 1 illustrates an embodiment of ADC 100 that may include a small DAC 110 and a large DAC 120. Both DACs 110, 120 may be coupled to a common input of a comparator 130. Switch $SW_{DAC}$ may selectively couple and decouple the large DAC 120 from the comparator 130. $SW_R$ may reset the comparator 130. The small DAC 110 may include a first set of capacitors $C_{S1}$-$C_{SM}$ that correspond to the first M bit positions of the ADC codeword, extending from the most significant bit ($C_{S1}$) to the Mth bit position ($C_{SM}$). The small DAC 110 may also include a first set of switches $SW_{S1}$-$SW_{SM}$ coupled to corresponding capacitors $C_{S1}$-$C_{SM}$. The large DAC 120 may include N capacitors $C_{L1}$-$C_{LN}$ and N switches $SW_{L1}$-$SW_{LN}$ corresponding to each of the N bit positions of the ADC. A bridging capacitor $C_B$ may be between capacitors $C_{L1}$-$C_{LM}$ and capacitors $C_{LM+1}$-$C_{LN}$. The large DAC 120 may also include an a redundant bit capacitor $C_{LX}$ to correct for noise and mismatch errors in the ADC.

Figure 2:
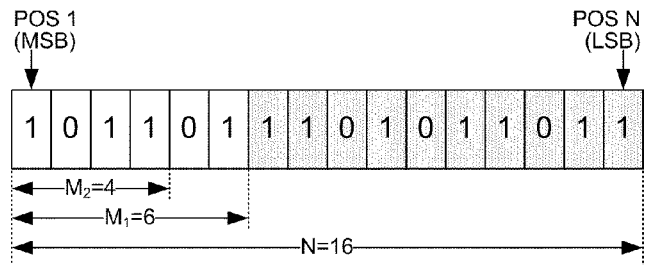
FIG. 2 is an example of a 16 bit digital codeword.

The capacitor arrays of both DACs 110, 120 may be binary weighted capacitors. In implementation, capacitors $C_{L1}$-$C_{LM}$ in the large DAC may be larger than their corresponding capacitors $C_{S1}$-$C_{SM}$ of the small DAC by a predetermined factor (e.g., 40×, 10×, 4×). Table 1 and Table 2 illustrate two examples of candidate values for large and small DACs 110, 210 that correspond to a 16 bit ADC with digital codeword 200 of FIG. 2:

TABLE 1

| BIT POSITION | SIZE OF LARGE DAC CAPACITOR | SIZE OF SMALL DAC CAPACITOR FOR $M_2$ |
|---|---|---|
| 1 | 3.2 pF | 80 fF |
| 2 | 1.6 pF | 40 fF |
| 3 | 0.8 pF | 20 fF |
| 4 | 0.4 pF | 10 fF |

TABLE 2

| BIT POSITION | SIZE OF LARGE DAC CAPACITOR | SIZE OF SMALL DAC CAPACITOR FOR $M_1$ |
|---|---|---|
| 1 | 3.2 pF | 320 fF |
| 2 | 1.6 pF | 160 fF |
| 3 | 0.8 pF | 80 fF |
| 4 | 0.4 pF | 40 fF |
| 5 | 0.2 pF | 20 fF |
| 6 | 0.1 pF | 10 fF |

In the example of Table 1, the small DAC 110 would include four capacitors corresponding to the four most significant bits of the output code word; the ratio of large DAC capacitors to small DAC capacitors is 40:1, in this example. In the example of Table 2, the small DAC 110 would include six capacitors corresponding to the six most significant bits of the output code word; the ratio of large DAC capacitors to small DAC capacitors is 10:1, in this example. Other implementations are possible; for example small DACs of 4-7 capacitors are foreseen.

To conserve power the smallest capacitor of $C_{SM}$ of the small DAC may be the smallest capacitor available given current manufacturing techniques. It is expected that, during manufacture, it will be difficult to maintain precise scaling among the binary weighted capacitors of the small DAC 110 and, therefore, bit trials of the small DAC 110 may be inaccurate as compared to bit trials performed by the large DAC 120 where precision is easier to maintain. Consequently, the large DAC 120 may include a redundant bit capacitor $C_{LX}$ and switch $SW_X$ to correct such errors. $C_{LX}$ should be a capacitor having capacitance corresponding to a bit position lower than, or equal to M, which can correct for errors that might arise due to the imprecision of the small DAC 110.

At a high level, the ADC 100 may operate like a conventional charge redistributed ADC. Operation may proceed through two phases. In an acquisition phase, ADC 100 may sample an input voltage of a undetermined magnitude. In a bit trial phase, ADC 100 may convert the input voltage to a digital codeword representing the input magnitude according to bitwise test, which is an iterative trial and error process. In a first iteration (i=0), the input voltage may be compared to a first test voltage corresponding to 1000 . . . 0 (e.g., MSB=1 and all other bit positions=0). The comparator may generate an output voltage indicating whether input voltage is greater than or less than the first test voltage. If the comparison yields a high output, the MSB bit is 1, and conversely, if the comparison yields a low output, the MSB bit is 0. In the next iteration, the bitwise test may compare the input voltage to a new test voltage corresponding to known bit positions (MSB through bit i−1), and '1' at $bit_i$ and '0' for all other bit positions through LSB. The bitwise test may continue until the LSB is calculated. At the end of the process, the ADC 100 may generate a codeword representing the magnitude of the input voltage.

Figure 3:
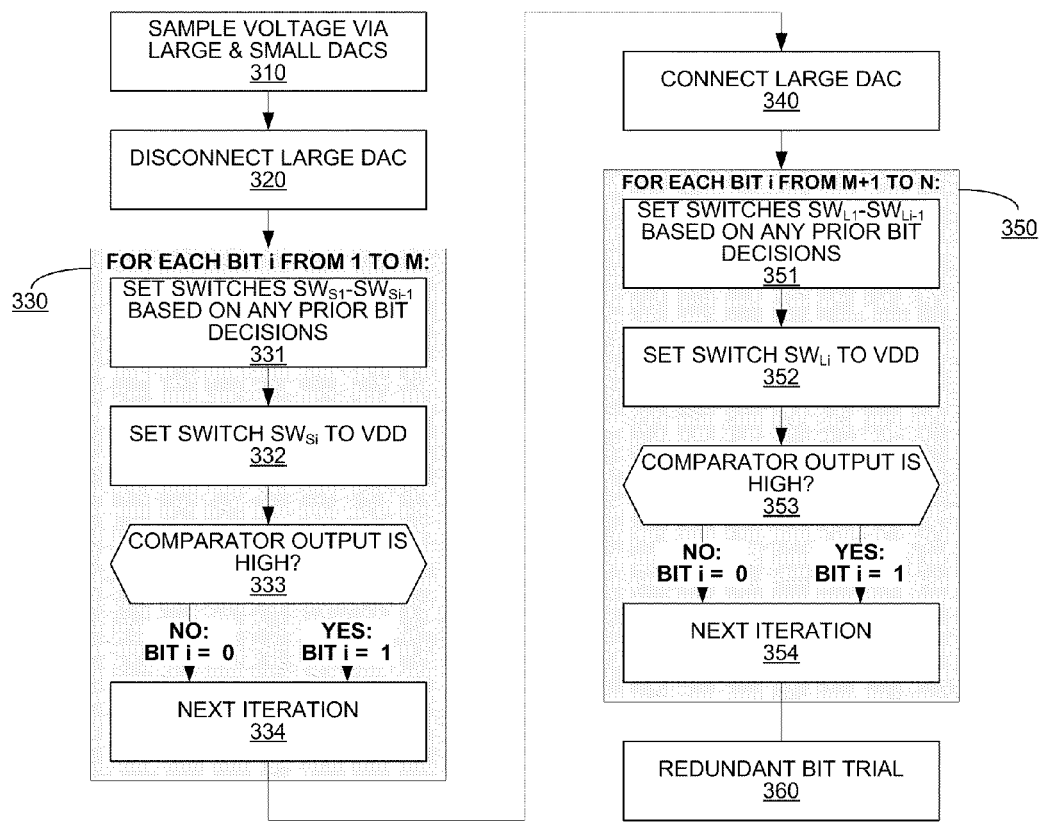
FIG. 3 shows a simplified process flow according to the embodiment of FIG. 1.

In an ADC 100 with a dual DAC structure 110, 120, the bitwise test operations in a may toggle between the two DACs. FIG. 3 is a flow diagram of a method 300 to generate a digital codeword according to an embodiment of the present invention. First, both small DAC 110 and large DAC 120 may sample the input voltage (block 310). Next, the large DAC 120 may be disconnected from the positive input of the comparator 130 (block 320). The small DAC may then perform bit trials of bit positions 1 to M (block 330). Each iteration may resolve a bit position of the N bit code. Each iteration may start with setting switches $SW_{S1}$-$SW_{S(i-1)}$ based on any prior bit decisions (block 331). Next, switch $SW_{Si}$ may be set to $V_{DD}$ (block 332). The output of the small DAC 110 may be compared to a test voltage for that bit position (block 333). If the comparison yields a high output, then $bit_i$ is resolved as 1, and conversely, if the comparison yields a low output, then $bit_i$ is resolved as 0. The method may progress to the next iteration until all M bits are calculated (block 334).

After all M bits are calculated by the small DAC 110, the large DAC 120 may be reconnected to the comparator 130 (block 340). At this time, all M bits resolved by the small DAC 110 may be shifted and the large DAC switches $SW_{L1}$-$SW_{LM}$ may be set according to the results of the bit trials performed by the small DAC 110. The large DAC 120 then may perform bit trials of bit positions M+1 to N (block 350). Each iteration may resolve a bit position of the N bit code. Each iteration may start with setting switches ($SW_{L1}$-$SW_{L(i-1)}$) based on any prior bit decisions (block 351). Next, switch $SW_{Li}$ may be set to $V_{DD}$ (block 352). The output of the Large DAC may be compared to a test voltage a test voltage for that bit position (block 353). If the comparison yields a high output, then $bit_i$ is resolved as 1, and conversely, if the comparison yields a low output, then $bit_i$ is resolved as 0. The method may progress to the next iteration until the Nth bit is calculated (block 354). The large DAC 120 may also perform bit a redundant bit test at some bit position i (where i>M) to test and correct for any errors at the small DAC 110 (block 360). If the redundant test is resolved as a '1', the digital code generated thus far may be incremented by the weight of the redundant bit.

As seen, method 300 may calculate all N bit positions through the bitwise test but uses the small DAC 110 to calculate the bit positions 1 to M instead of the large DAC 120. Therefore, capacitors $C_{L1}$-$C_{LM}$ in the large DAC do not need to be charged and discharged for the bit trials of bit positions 1 to M. Capacitors $C_{L1}$-$C_{LM}$ may be the largest capacitors in the ADC and are much larger than their corresponding small DAC capacitors $C_{S1}$-$C_{SM}$. Similarly, small DAC switches $SW_{S1}$-$SW_{SM}$ may be much smaller and have faster settling times as compared to their corresponding switches from the large DAC. Therefore, method 300 minimizes power consumption and provides increased speed in comparison to performing bit trials via capacitors $C_{L1}$-$C_{LM}$ and switches $SW_{L1}$-$SW_{LM}$.

Figure 4:
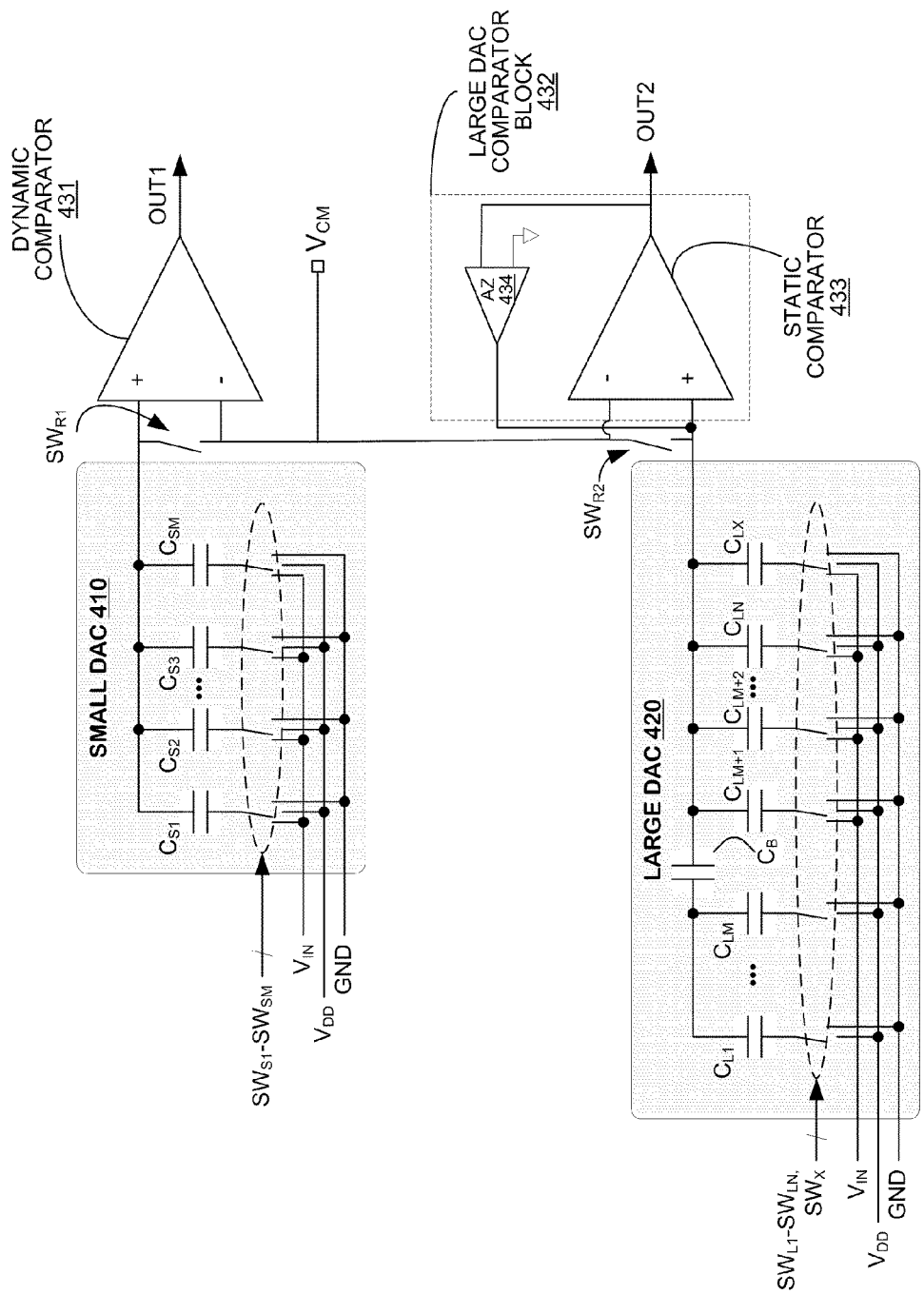
FIG. 4 is a simplified diagram of a charge redistributed ADC according to an embodiment of the present invention.

FIG. 4 illustrates an embodiment of ADC 400 that may include a dual DAC structure 410, 420 with each DAC having its own corresponding comparator 431, 432. The small DAC 410 may be coupled to a dynamic comparator 431 while the large DAC 420 may be coupled to a large DAC comparator block 432. The dynamic comparator 431 may be a small, low accuracy comparator. The dynamic comparator 431 may also be fast, low power, or a combination of fast and low power with a tradeoff between speed and power. For example, the dynamic comparator may be a small, low accuracy, and fast comparator. The large DAC comparator block 432 may include a static comparator 433 and an auto-zero cycle component 434. The static comparator 433 may be a larger, slower, higher accuracy, and higher power comparator as compared to the dynamic comparator 431. The static comparator 433 may have a power-up cycle and an auto-zero cycle. The two comparator system may allow the large DAC comparator block 432 to power down when not in use thereby conserving power. For example, the large DAC comparator block 432 may begin its power-up cycle when the small DAC 410 is performing bit trials and power down again after the large DAC 420 completes its bit trials. Each comparator may be coupled to a resetting switch $SW_{R1}$, $SW_{R2}$ to reset each comparator respectively.

The small DAC 410 may include a first set of capacitors $C_{S1}$-$C_{SM}$ that correspond to the first M bit positions of the ADC codeword, extending from the most significant bit ($C_{S1}$) to the Mth bit position ($C_{SM}$). The small DAC 410 may also include a first set of switches $SW_{S1}$-$SW_{SM}$ coupled to corresponding capacitors $C_{S1}$-$C_{SM}$. The large DAC 420 may include N capacitors $C_{L1}$-$C_{LN}$ and N switches $SW_{L1}$-$SW_{LN}$ corresponding to each of the N bit positions of the ADC. A bridging capacitor $C_B$ may be between capacitors $C_{L1}$-$C_{LM}$ and capacitors $C_{LM+1}$-$C_{LN}$. The large DAC 420 may also include an a redundant bit capacitor $C_{LX}$ to correct for noise and mismatch errors in the ADC.

Figure 5:
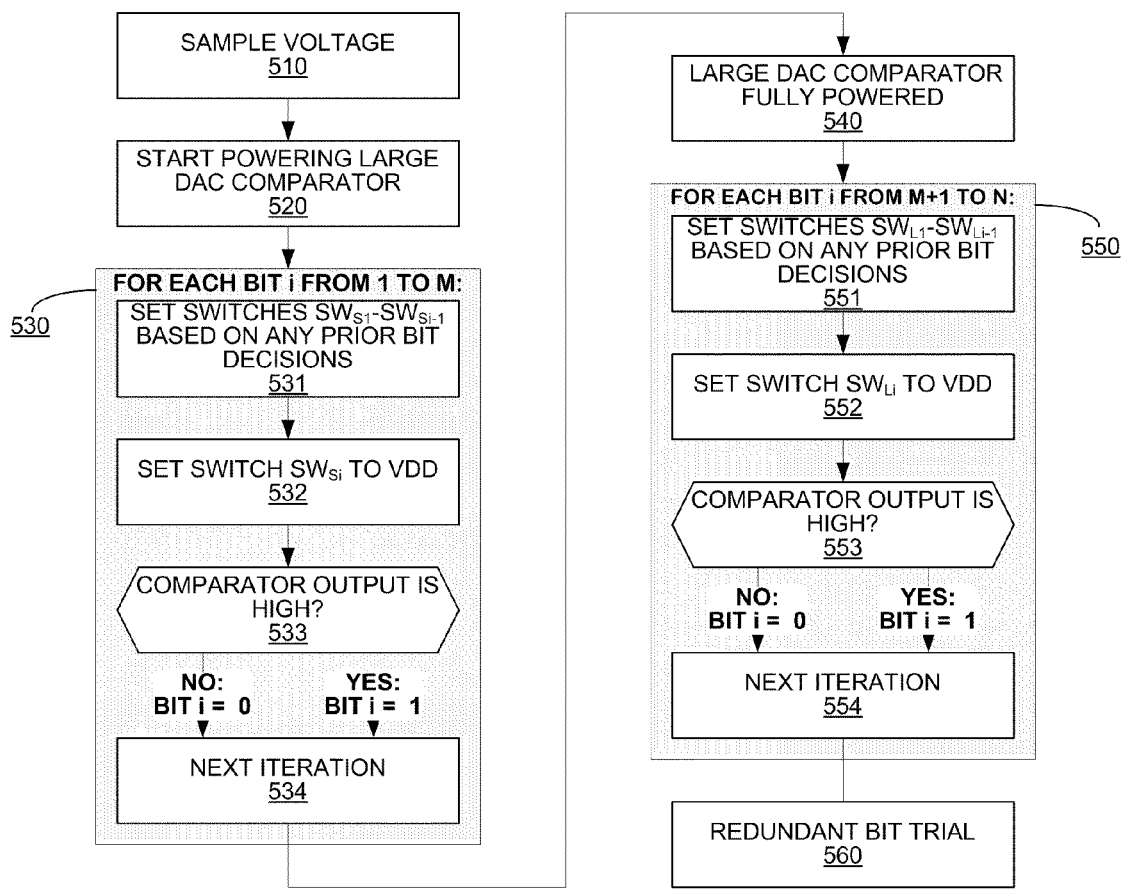
FIG. 5. shows a simplified process flow according to the embodiment of FIG. 4.

FIG. 5 is a flow diagram of a method 500 to generate a digital codeword according to an embodiment of the present invention. First, the input voltage may be sampled (block 510). The large DAC comparator block 432 may begin powering on (block 520). Alternatively, the large DAC comparator block 432 may begin powering on during any time the small DAC is performing bit trials. The small DAC may then perform bit trials of bit positions 1 to M (block 530). Each iteration may resolve a bit position of the N bit code. Each iteration may start with setting switches $SW_{S1}$-$SW_{S(i-1)}$ based on any prior bit decisions (block 531). Next, switch $SW_{Si}$ may be set to $V_{DD}$ (block 532). The output of the small DAC 410 may be compared to a test voltage for that bit position (block 533). If the comparison yields a high output, then $bit_i$ is resolved as 1, and conversely, if the comparison yields a low output, then $bit_i$ is resolved as 0. The method may progress to the next iteration until all M bits are calculated (block 534).

After all M bits are calculated by the small DAC 410, the large DAC comparator block 432 may be fully powered (block 540). At this time, all M bits resolved by the small DAC 410 may be shifted and the large DAC switches $SW_{L1}$-$SW_{LM}$ may be set according to the results of the bit trials performed by the small DAC 410. The large DAC 420 then may perform bit trials of bit positions M+1 to N (block 550). Each iteration may resolve a bit position of the N bit code. Each iteration may start with setting switches ($SW_{L1}$-$SW_{L(i-1)}$) based on any prior bit decisions (block 551). Next, switch $SW_{Li}$ may be set to $V_{DD}$ (block 552). The output of the Large DAC may be compared to a test voltage a test voltage for that bit position (block 553). If the comparison yields a high output, then $bit_i$ is resolved as 1, and conversely, if the comparison yields a low output, then $bit_i$ is resolved as 0. The method may progress to the next iteration until the Nth bit is calculated (block 554). The large DAC 420 may also perform bit a redundant bit test at some bit position i (where i>M) to test and correct for any errors at the small DAC 110 (block 560). If the redundant test is resolved as a '1', the digital code generated thus far may be incremented by the weight of the redundant bit. After all bits are calculated the large DAC comparator block 432 may power down.

Figure 6:
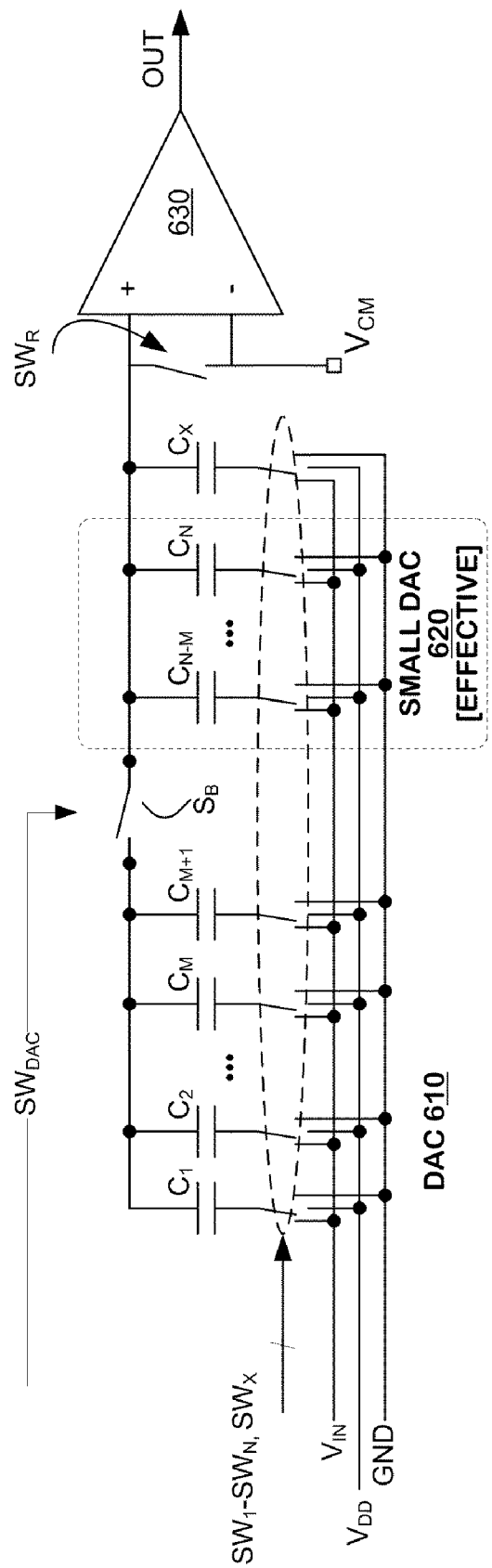
FIG. 6 is a simplified diagram of a charge redistributed ADC according to an embodiment of the present invention.

FIG. 6 illustrates an embodiment of ADC 400 that may include a single DAC 610 coupled to a comparator 630. The DAC 610 may include a binary weighted capacitor array $C_1$-$C_N$ and switch array $SW_1$-$SW_N$, corresponding to each of the N bit positions of the ADC. DAC 610 may also include a bridging switch $S_B$ to selectively decouple a portion of DAC 610 from the comparator input during a first operation. Thus the bridging switch SB defines a subset of DAC capacitors, $C_{N-M}$-$C_N$, and switches $SW_{N-M}$-$SW_N$ that may operate as an effective small DAC 620. $SW_R$ may reset the comparator 630. Furthermore, DAC 610 may include a redundant bit capacitor $C_X$ to correct for noise and mismatch errors in the ADC.

Figure 7:
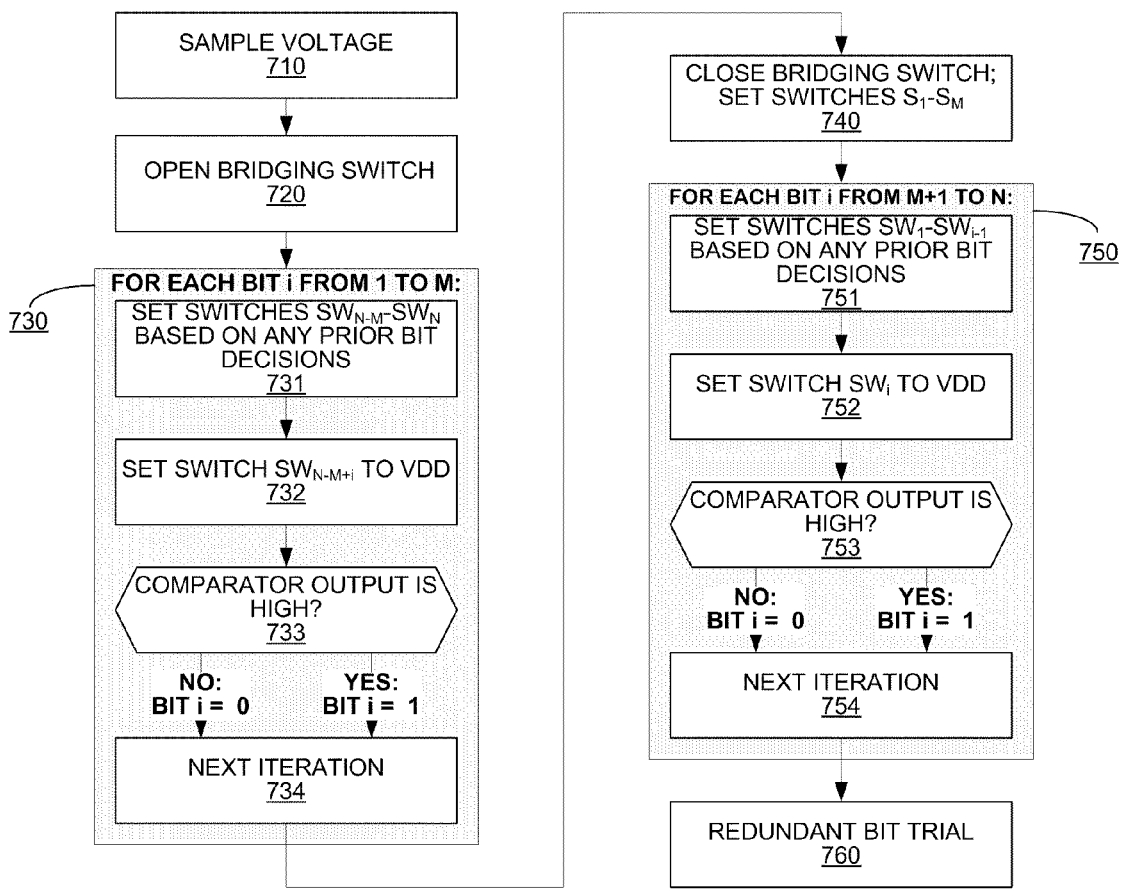
FIG. 7. shows a simplified process flow according to the embodiment of FIG. 6.

FIG. 7 is a flow diagram of a method 700 to generate a digital codeword according to an embodiment of the present invention. First, the DAC 410 may sample the input voltage across all capacitors $C_1$-$C_N$ (block 710). Next, the bridging switch $S_B$ may be opened (block 720). The effective small DAC 620 may then perform bit trials of bit positions 1 to M (block 730). Each iteration may resolve a bit position of the N bit code. Each iteration may start with setting switches $SW_{N-M}$-$SW_{(i-1)}$ based on any prior bit decisions (block 731). Next, switch $SW_{N-M+i}$ may be set to VDD (block 732). The output of the effective small DAC may be compared to a test voltage for that bit position (block 733). If the comparison yields a high output, then $bit_i$ is resolved as 1, and conversely, if the comparison yields a low output, then $bit_i$ is resolved as 0. The method may progress to the next iteration until all M bits are calculated (block 734).

After all M bits are calculated by the effective small DAC 620, bridging switch $S_B$ may be closed to reconnect the decoupled capacitors to the comparator 630 (block 740). At this time, switches $SW_1$-$SW_M$ may be set according to the results of the bit trials performed by the effective small DAC 620. The DAC 610 may then perform bit trials of bit positions M+1 to N (block 750). Each iteration may resolve a bit position of the N bit code. Each iteration may start with setting switches ($SW_1$-$SW_{(i-1)}$) based on any prior bit decisions (block 751). Next, switch $SW_i$ may be set to VDD (block 752). The output of the DAC 610 may be compared to a test voltage a test voltage for that bit position (block 753). If the comparison yields a high output, then $bit_i$ is resolved as 1, and conversely, if the comparison yields a low output, then $bit_i$ is resolved as 0. The method may progress to the next iteration until the Nth bit is calculated (block 754). The DAC 610 may also perform bit a redundant bit test at some bit position i (where i>M) to test and correct for any errors at the effective small DAC 620 (block 760). If the redundant test is resolved as a '1', the digital code generated thus far may be incremented by the weight of the redundant.

As seen, method 700 may calculate all N bit positions through the bitwise test but uses an effective small DAC 620 to calculate bit positions 1 to M instead of using capacitors $C_1$-$C_M$ and switches $SW_1$-$SW_M$. The effective small DAC capacitors and switches may be the smallest capacitors and switches in DAC 610; therefore, method 700 minimizes power consumption and provides increased speed in comparison to performing bit trials via capacitors $C_1$-$C_M$ and switches $SW_1$-$SW_M$.

Several embodiments of the present invention are specifically illustrated and described herein. However, it will be appreciated that modifications and variations of the present invention are covered by the above teachings and within the purview of the appended claims without departing from the spirit and intended scope of the invention.

I claim:

1. A charge redistributed analog to digital converter (ADC) to generate a digital codeword from an input voltage, comprising:
   a comparator,
   a pair of binary weighted capacitor arrays, each coupled to the comparator, wherein:
   the first capacitor array has fewer capacitors than the second capacitor array,
   the first capacitor array performs bit trials of a plurality of most significant bits of the codeword,
   the second capacitor array performs bit trials of remaining bits of the codeword after having been set with bit decisions from the bit trials of the first capacitor array.

2. The ADC of claim 1 further comprising:
   a switch to selectively couple the second capacitor array to the comparator.

3. The ADC of claim 1 further comprising:
   a redundant bit capacitor to correct for noise and mismatch errors.

4. A charge redistributed analog to digital converter (ADC) to generate a digital codeword from an input voltage, comprising:
   a first comparator,
   a second comparator, and
   a pair of binary weighted capacitor arrays, a first capacitor array coupled to the first comparator and a second capacitor array coupled to the second comparator, wherein:
   the first capacitor array has fewer capacitors than the second capacitor array,
   the first capacitor array performs bit trials of a plurality of most significant bits of the codeword,
   the second capacitor array performs bit trials of remaining bits of the codeword after having been set with bit decisions from the bit trials of the first capacitor array.

5. The ADC of claim 4 further comprising:
a redundant bit capacitor to correct for noise and mismatch errors.

6. The ADC of claim 4, wherein the second comparator is powering on during the first capacitor performed bit trials.

7. The ADC of claim 4, wherein the first comparator is a dynamic comparator and the second comparator is a static comparator.

8. A charge redistributed analog to digital converter (ADC) to generate a digital codeword from an input voltage, comprising:
a comparator,
a capacitor array coupled to an input of the comparator, comprising a set of binary weighted capacitors, a first sub-set of capacitors being continuously coupled to the comparator input during bit trials and a second sub-set of capacitors being selectively coupled to the comparator during bit trials, wherein
the first sub-set of capacitors performs bit trials of a plurality of most significant bits of the codeword while the second sub-set of capacitors is disconnected from the comparator,
the full set of capacitors performs bit trials of remaining bits of the codeword after the second sub-set of capacitors is re-connected to the comparator and the full set of capacitors is set with bit decisions from the bit trials of the first sub-set.

9. The ADC of claim 8 further comprising:
a redundant bit capacitor to correct for noise and mismatch errors.

10. The ADC of claim 8 further comprising:
a switch to selectively couple the second sub-set of capacitors to the comparator.

11. A method to convert an analog signal to a digital codeword having N bit positions, comprising:
sampling the analog signal by a small DAC and a large DAC;
coupling the small DAC to a comparator;
calculating bit position values 1 to M by a bitwise operation using the small DAC;
coupling the large DAC to the comparator;
setting switch values for a subset of large DAC switches according to the calculated bit positions 1 to M;
calculating bit position values M+1 to N by a bitwise operation using the large DAC; and
generating the digital codeword.

12. The method of claim 11, further comprising:
performing a redundant bit test to correct for noise and mismatch errors.

13. The method of claim 12, wherein the redundant bit test is performed at bit position i where i>M.

14. The method of claim 11, wherein bit positions 1 to M are the most significant bit positions of the digital codeword.

15. A method to convert an analog signal to a digital codeword having N bit positions, comprising:
sampling the analog signal;
calculating bit position values 1 to M by a bitwise operation using a small DAC and a first comparator;
powering up a second comparator coupled to a large DAC;
setting switch values for a subset of large DAC switches according to the calculated bit positions 1 to M;
calculating bit position values M+1 to N by a bitwise operation using the large DAC and the second comparator; and
generating the digital codeword.

16. The method of claim 15, further comprising:
performing a redundant bit test to correct for noise and mismatch errors.

17. The method of claim 16, wherein the redundant bit test is performed at bit position i where i>M.

18. The method of claim 15, wherein bit positions 1 to M are the most significant bit positions of the digital codeword.

19. A method to convert an analog signal to a digital codeword having N bit positions, comprising:
sampling the analog signal by a DAC, wherein the DAC is coupled to a comparator;
decoupling a portion of the DAC from the comparator thereby defining an effective small DAC still coupled to the comparator;
calculating bit positions 1 to M by a bitwise operation using the effective small DAC;
re-coupling the decoupled portion of the DAC to the comparator;
setting switch values for a subset of DAC switches according to the calculated bit positions 1 to M;
calculating bit position values M+1 to N by a bitwise operation using the DAC; and
generating the digital codeword.

20. The method of claim 19, further comprising:
performing a redundant bit test to correct for noise and mismatch errors.

21. The method of claim 20, wherein the redundant bit test is performed at bit position i where i>M.

22. The method of claim 19, wherein bit positions 1 to M are the most significant bit positions.

23. An analog to digital converter (ADC) having N bit positions, comprising:
a small DAC comprising:
a set of M capacitors, and
a set of M switches;
a large DAC comprising:
a set of N capacitors corresponding to each of the N bit positions, wherein a first subset of N capacitors correspond to the small DAC's M capacitors, and
a set of N switches, wherein a first subset of N switches correspond to the small DAC's M switches; and
a comparator coupled to the small DAC and the large DAC,
wherein the small DAC perform bit trials to calculate bit positions 1 to M, and
wherein the large DAC perform bit trials to calculate bit positions M+1 to N by setting the switch values for the first subset of N switches according to the calculated bit positions 1 to M.

24. The ADC of claim 23 further comprising:
a switch to selectively couple the large DAC to the comparator.

25. The ADC of claim 23, wherein the first subset of N capacitors are larger than their corresponding small DAC's M capacitors by a predetermined factor.

26. The ADC of claim 23, the large DAC further comprising:
a redundant bit capacitor to correct for noise and mismatch errors.

27. The ADC of claim 23, wherein bit positions 1 to M are the most significant bit positions of the digital codeword.

28. An analog to digital converter (ADC) having N bit positions, comprising:
- a small DAC comprising:
  - a set of M capacitors, and
  - a set of M switches;
- a large DAC comprising:
  - a set of N capacitors corresponding to each of the N bit positions, wherein a first subset of N capacitors correspond to the small DAC's M capacitors, and
  - a set of N switches, wherein a first subset of N switches correspond to the small DAC's M switches;
- a first comparator coupled to the small DAC; and
- a second comparator coupled to the large DAC,
- wherein the small DAC perform bit trials to calculate bit positions 1 to M, and
- wherein the large DAC perform bit trials to calculate bit positions M+1 to N by setting the switch values for the first subset of N switches according to the calculated bit positions 1 to M.

29. The ADC of claim 28, wherein the second comparator is powering on during the small DAC performed bit trials.

30. The ADC of claim 28, wherein the first comparator is a dynamic comparator and the second comparator is a static comparator.

31. The ADC of claim 28, wherein the first subset of N capacitors are larger than their corresponding small DAC's M capacitors by a predetermined factor.

32. The ADC of claim 28, the large DAC further comprising:
- a redundant bit capacitor to correct for noise and mismatch errors.

33. The ADC of claim 28, wherein bit positions 1 to M are the most significant bit positions of the digital codeword.

34. An analog to digital converter (ADC) having N bit positions, comprising:
- a comparator; and
- a DAC coupled to the comparator, comprising:
  - a set of N capacitors corresponding to each of the N bit positions,
  - a set of N switches corresponding to each of the N bit positions, and
  - a bridging switch to selectively decouple a portion of N capacitors and N switches during a first operation, wherein the bridging switch defines an effective small DAC coupled to the comparator,
- wherein the effective small DAC and the comparator perform bit trials to calculate bit positions 1 to M during the first operation, and
- wherein the large DAC and the comparator perform bit trials to calculate bit positions M+1 to N by setting the switch values for a first subset of N switches according to the calculated bit positions 1 to M.

35. The ADC of claim 34, the DAC further comprising:
- a redundant bit capacitor to correct for noise and mismatch errors.

36. The ADC of claim 34, wherein bit positions 1 to M are the most significant bit positions of the digital codeword.

* * * * *